United States Patent [19]
Izura et al.

[11] 3,974,420
[45] Aug. 10, 1976

[54] DEFLECTION APPARATUS

[75] Inventors: Yoshiteru Izura, Toyonaka; Keisuke Okano, Katano; Masaaki Nakano, Shijonawate, all of Japan

[73] Assignee: Matsushita Electric Industrial Co., Ltd., Osaka, Japan

[22] Filed: Sept. 10, 1973

[21] Appl. No.: 395,437

[30] Foreign Application Priority Data
Sept. 14, 1972  Japan.............................. 47-92585

[52] U.S. Cl............................ 315/379; 340/324 AD
[51] Int. Cl.² ......................................... H01J 29/52
[58] Field of Search............. 340/324 AD; 235/198; 315/379

[56] References Cited
UNITED STATES PATENTS

| | | |
|---|---|---|
| 3,015,814 | 1/1962 | Lippel.................................... 235/198 |
| 3,098,929 | 7/1963 | Kirchner............................... 235/198 |
| 3,248,725 | 4/1966 | Low et al. ..................... 340/324 AD |
| 3,418,459 | 12/1968 | Purdy et al. ......................... 235/198 |
| 3,428,851 | 2/1969 | Greenblum ................... 340/324 AD |
| 3,428,852 | 2/1969 | Greenblum .................. 340/324 AD |
| 3,480,943 | 11/1969 | Manber....................... 340/324 AD |

Primary Examiner—Maynard R. Wilbur
Assistant Examiner—G. E. Montone
Attorney, Agent, or Firm—Stevens, Davis, Miller & Mosher

[57] ABSTRACT

The present invention relates to deflection apparatus which can appropriately scan the target and other parts of a storage tube when recording and reproducing on the storage tube a plurality of signals which are different from one another. The apparatus can be constructed from simple circuits and is directed toward the driving of a deflection coil of high inductance.

3 Claims, 16 Drawing Figures

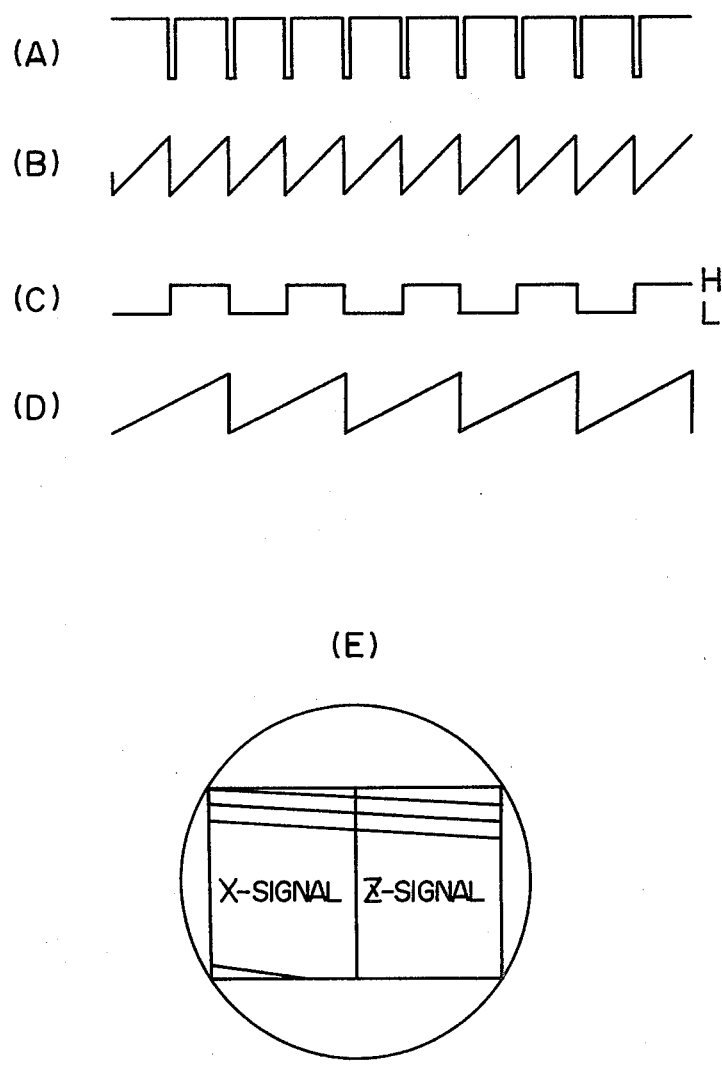

FIG. 9
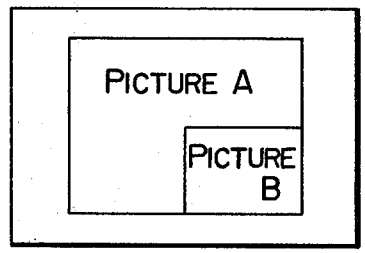
FIG. 10
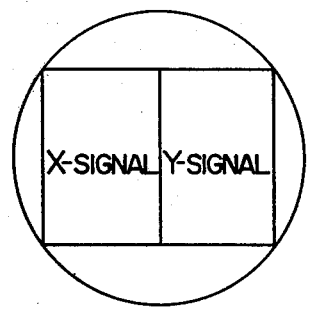
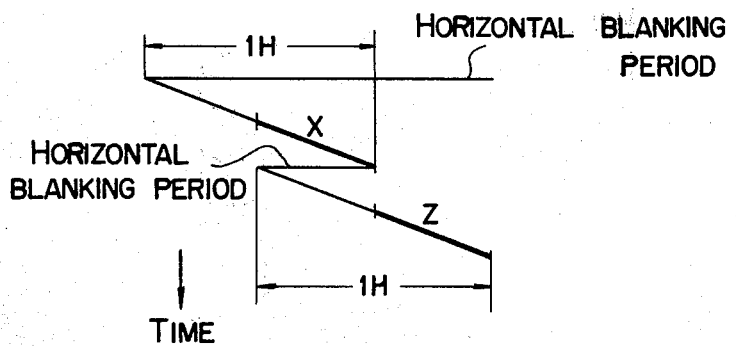

DEFLECTION APPARATUS

The present invention relates to a deflection apparatus wherein a plurality of different areas can be scanned one after another by an electron beam.

It is a first object of the present invention to provide a deflection apparatus which is simple to construct and provides a pulse type of deflection.

It is a second object of the present invention to provide a deflection apparatus which appropriately records and reproduces two kinds of chrominance signals on a storage tube.

The apparatus according to the present invention can be employed as the deflection apparatus for a cathode ray tube as well as for a storage tube.

A high conductance deflection coil can also be provided because the apparatus according to the present invention provides a pulse mode deflection circuit. In addition this pulse mode deflection circuit makes the circuit configuration simpler and thus the apparatus less expensive.

Other objects, features and advantages of the present invention will be apparent from the following description taken in conjunction with the accompanying drawings, in which:

FIG. 3 is a signal waveform diagram;

FIG. 9 shows a picture projection on a cathode ray tube;

FIG. 10 shows the read-out of a picture on the cathode ray tube;

An embodiment of the apparatus will be described wherein any desired frame is arbitrarily removed from a color television signal, the luminance signal and two chrominance signals in the television signal are respectively recorded on first and second storage tubes and these signals are iteratively read out to project a color still picture.

Figure 1:
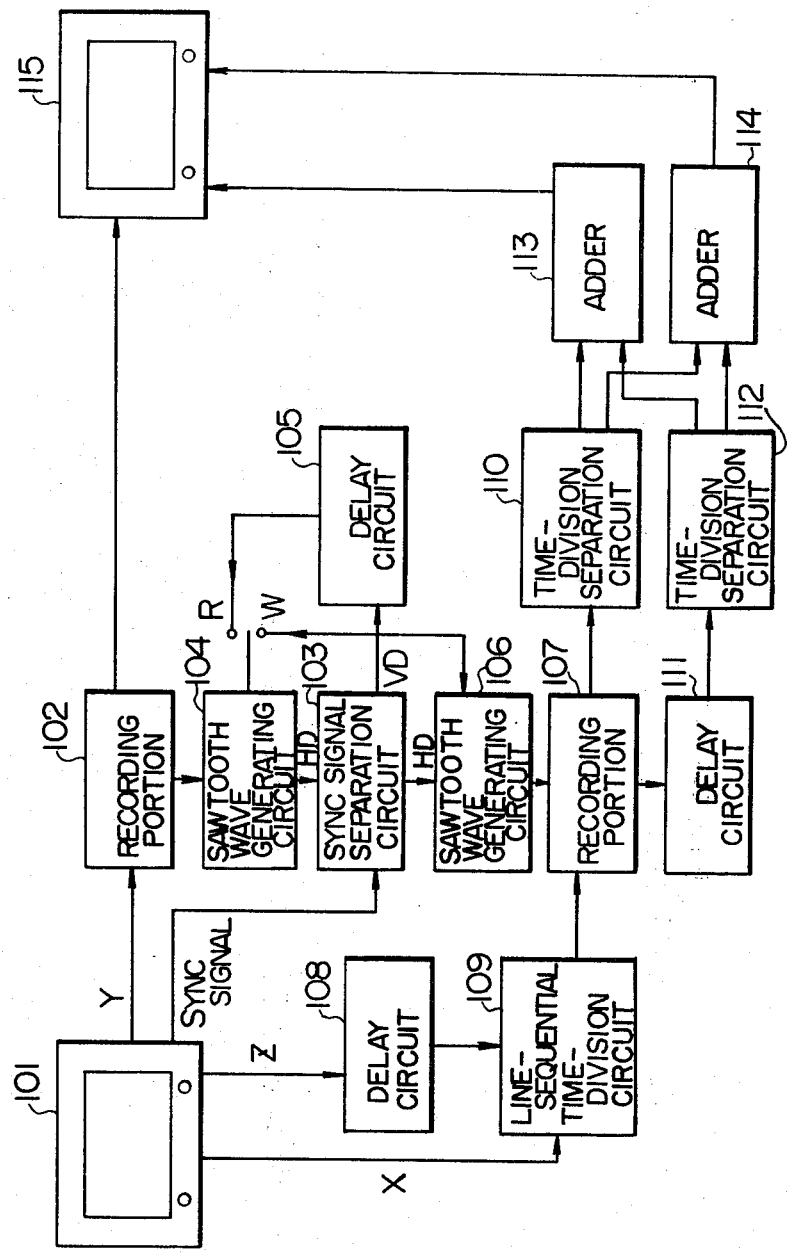
FIG. 1 is a block diagram of the apparatus for recording and reproducing chrominance still picture.
Figure 2:
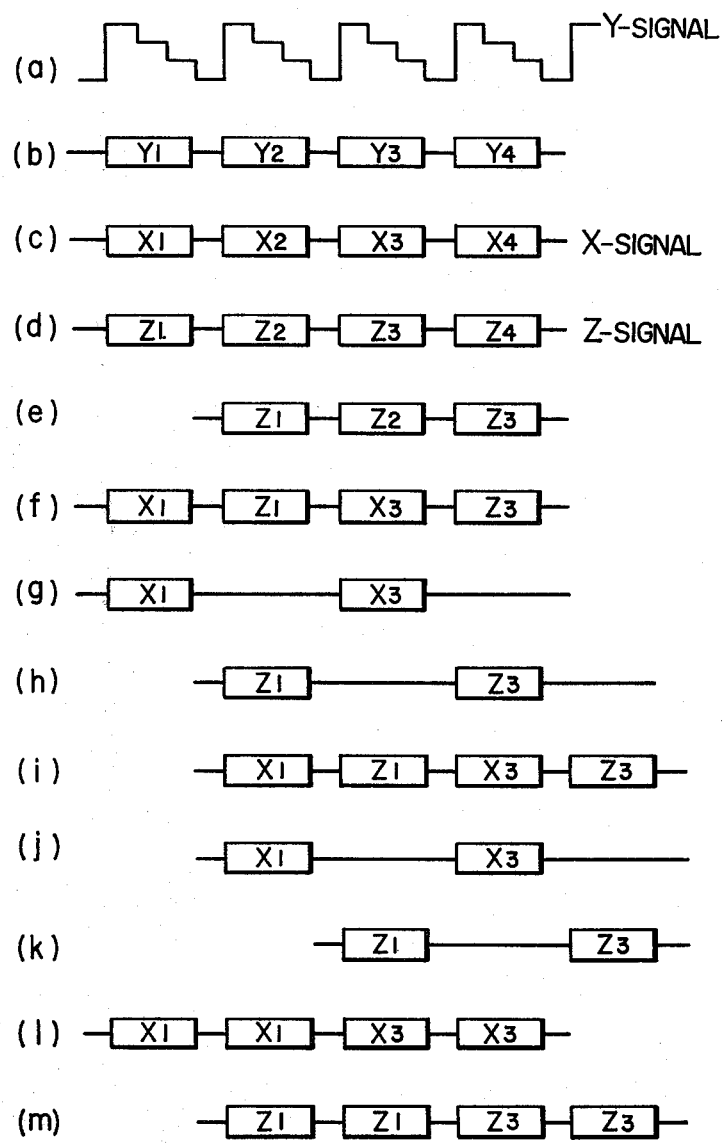
FIG. 2 is a block diagram explaining the signal processing by use of said apparatus.

FIG. 1 is a block diagram of the apparatus according to the present invention in its entirety. Numeral 101 designates a color television receiver which is constructed so that the luminance signal (Y signal), chrominance signals (X signal and Z signal) and sync signal are taken out of the instrument. Numeral 102 designates a luminance signal recording portion, 103 a synchronizing signal separation circuit, 104 and 106 sawtooth wave generating circuits for deflecting signal storage tubes (memory tubes provided in the recording portions 102 and 107 respectively, 105 a delay circuit for delaying the vertical driving signal by a single horizontal scanning period (1H), 107 a chrominance signal recording portion, 108 a delay circuit for delaying the Z signal by 1H, 109 a line-sequential time-division circuit, 110 and 112 line-sequential time-division separation circuits, 111 a delay circuit for delaying a signal by 1H, 113 and 114 adder circuits, and 115 a monitor color television receiver. The luminance signal from the color television receiver 101 is recorded on the storage tube in the recording portion 102. In this case, the scanning of the storage tube may be achieved in the same manner as in a conventional television receiver. The X and Z chrominance signals are alternatively recorded at the interval of 1H and during reproduction each one of the X and Z signals is delayed by 1H and then the X and Z signals are added so that the missing portions of the X and Z signals are compensated. The detail of the process is shown in FIG. 2. Among two chrominance signals shown in FIGS. 2(c) and (d) the delaying of the Z signal by 1H produces FIG. 2(e). The X signal and Z signal are alternatively taken out from FIGS. 2(c) and (e) and added by use of the line-sequential time-division circuit to produce an output shown in FIG. 2(f). This signal is recorded on the storage tube in recording portion 107 with the horizontal scanning speed one half of its ordinary speed. On reading out the signals, the chrominance signals X and Z are alternatively read out from the storage tube and separated into an X signal shown in FIG. 2(g) and a Z signal shown in FIG. 2(h) by use of the time-division separation circuit 110. The output read out of the recording portion 107 is delayed by 1H as shown in FIG. 2(i) and separated into an X signal shown in FIG. 2(j) and a Z signal shown in FIG. 2(k) in the time-division separation circuit 112.

Here, the X signal and the Z signal are added in the adder circuits 113 and 114 respectively to produce outputs shown in FIGS. 2(l) and (m). These X and Z signals and the Y signal, which was delayed by 1H to match its phase against that of the X and Z signals are applied to the color monitor television receiver 115 to produce a color still picture. If deflection is effected by a horizontal deflection current having the waveform shown in FIG. 3(D) on recording the X and Z signals upon a single storage tube (memory tube), the X signal and the Z signal are respectively separately recorded on the left and right-hand sides of the target of a memory tube as shown in FIG. 3(E). Therefore this process achieves efficient color separation. FIGS. 3(A) and (B) respectively show horizontal driving voltage and ordinary horizontal deflection current. A flip-flop is driven by the signal shown in FIG. 3(A) to produce the output signal shown in FIG. 3(C). On taking out the X signal and the Z signal at the H and L sides of this output signal respectively the recording shown in FIG. 3(E) is performed.

Figure 4A:
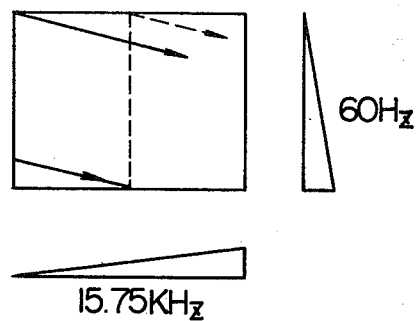
FIGS. 4a, 4b and 5 show the scanning of a storage tube target.
Figure 4B:
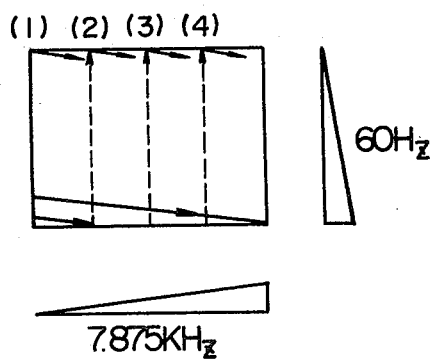
Figure 5:
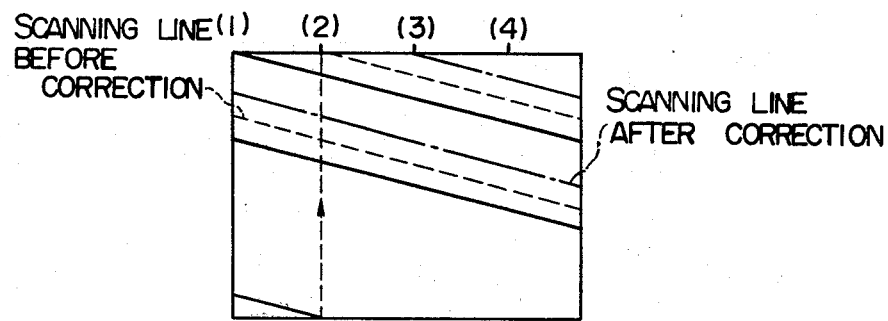
Figure 6A:
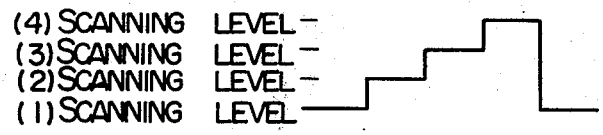
FIGS. 6a and 6b show scanning signals.
Figure 6B:
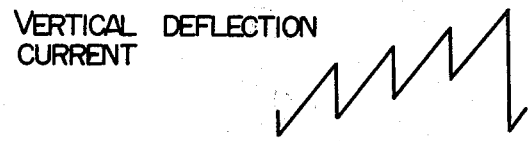
Figure 7:
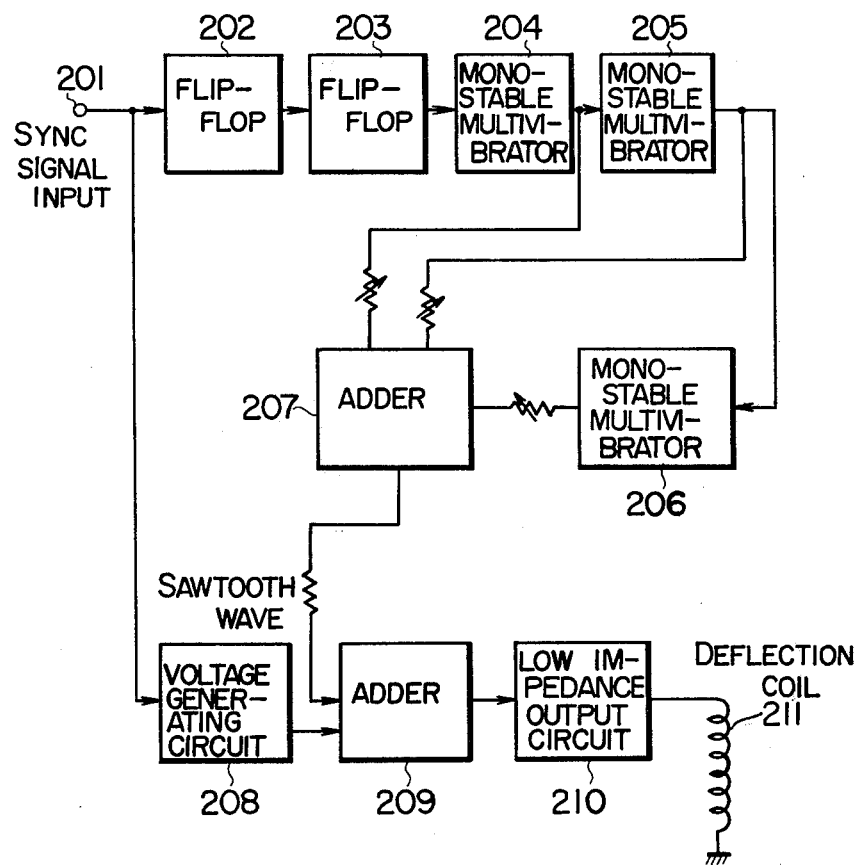
FIG. 7 is a block diagram showing an embodiment of a deflection apparatus according to the present invention.
Figure 8:
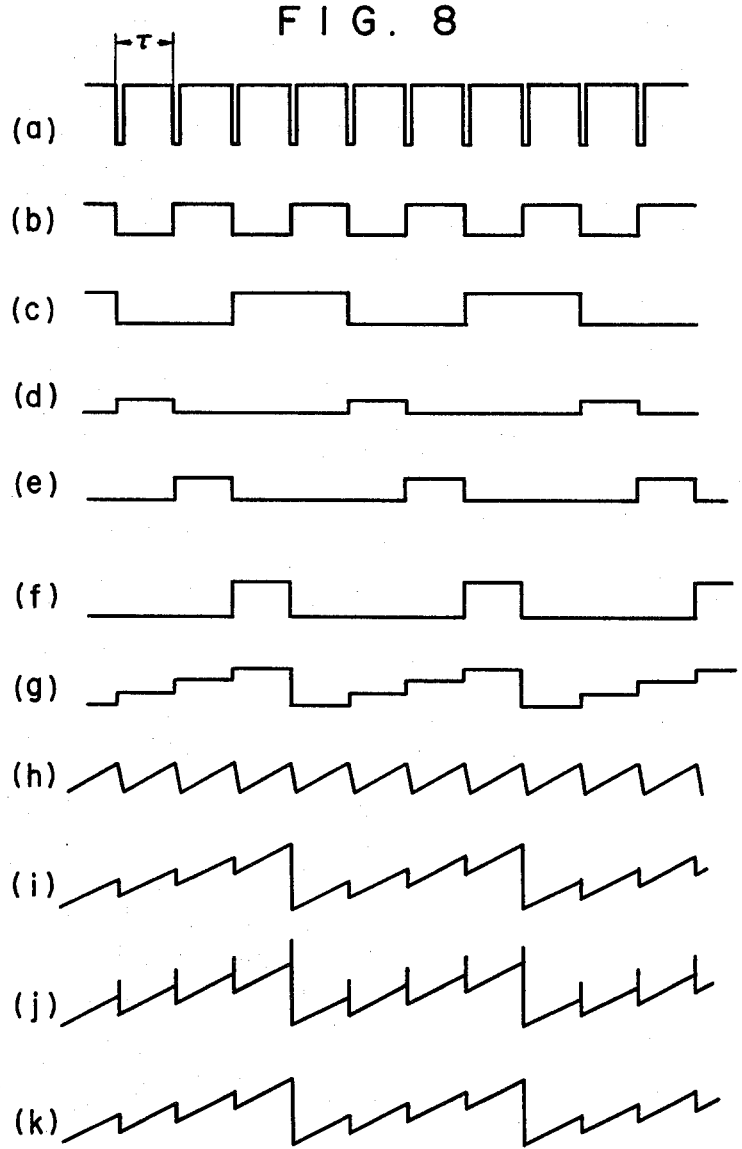
FIG. 8 is a waveform diagram for the apparatus shown in FIG. 7.

On the other hand, as shown in FIG. 4(a), in the conventional raster scanning a picture is constructed by 525 scanning lines which are operated at frequencies of 15.75KHz and 60Hz in the horizontal and vertical directions respectively. As described above, when the frequency of the horizontal deflection is set at 7.875KHz, one half of the conventional frequency, as shown in FIG. 4(b), 131.25 = 525 × ¼ scanning lines complete a single field scanning and second field scanning is initiated at position (2). Thereafter, the initial positions of the field scanning are delayed by 1/60 second during a single scanning as shown by (1) → (2) → (3) → (4) in the figure. Consequently each one of the combinations of the field of position (1) and the field of (2), field of (2) and field of (3), field of (3) and field of (4), and field of (4) and field of (1) forms a picture. Since, in this case, a single picture is formed for 1/30 second, when, for example, recording is made by the scannings of (1) and (2), flickering occurs on reproduction as shown in FIG. 5 because no complete interlaced scanning is performed, and in case of scanning of (3) and (4) no picture is read out. Similar phenomena occur in cases of combination of scannings of (2) and (3), (3) and (4), and of (4) and (1). In order to overcome this difficulty, according to the present invention the following correction is made in the deflection circuit wherein the distance between scanning lines is made equidistant as shown in FIG. 5. In FIG. 4(b) this process is performed by the displacement of the scanning line at (2) to the position (3), the displacement of the scanning line at (3) to the position (1) and the displacement of the scanning line at (4) to the position (2). In order to perform the above correction it is necessary to add a staircase signal shown in FIG. 6(a) to the deflection current to produce the vertical deflection current shown in FIG. 6(b). FIG. 7 shows the block diagram of an embodiment of the improvement of the deflection apparatus according to the invention, wherein numerals 201 designate an input terminal of the sync signal, 202 and 203 flip-flops, 204, 205 and 206 monostable multivibrators which generate pulses in their falling periods, 207 an adder circuit, 208 a sawtooth wave voltage generating circuit, 209 an adder circuit, 210 a low impedance output circuit and 211 a deflection coil. In FIG. 8,(a) designates the sync signal, (b) the output waveform of flip-flop 202, (c) the output waveform of flip-flop 203, (d) the output waveform of the monostable multivibrator 206, (g) the output of the adder circuit 207, (h) the output waveform of the sawtooth wave generating circuit 208, (i) the output waveform of the adder circuit 209, (j) the output waveform of the low impedance output circuit 210 and (k) the deflection current flowing through the deflection coil 211.

The flip-flop 202 is operated by the sync signal received at the terminal 201, the flip-flop 203 is operated by the falling of the output of flip-flop 202 and these two flip-flops constitute a 1/4 counter. The monostable multivibrator 204 is operated by the falling of flip-flop 203 to produce pulses having width τ, which correspond to the frequency of the sync signal. Similarly the monostable multivibrators 205 and 206 are operated in their falling period to produce pulse having a width of τ. The outputs of the monostable multivibrators 204, 205 and 206 are applied to the adder circuit 207 to produce a staircase wave having the four steps shown in FIG. 8(g). The sawtooth wave voltage shown in FIG. 8(h) is generated in the sawtooth wave generating circuit 208 by the sync signal from the terminal 201, the output of the generating circuit 208 is applied to the adder circuit 209, wherein this input signal is added to the output of the adder circuit 207. The output of the adder circuit 209 is applied to the deflection coil 211 through the low impedance circuit 210 to produce the deflection current shown in FIG. 8(k).

Further, according to the present invention it is possible that the contents of record are displayed as a still picture on one-fourth of the total area of the screen of the television receiver and two different kinds of pictures are simultaneously displayed as shown in FIG. 9. In more detail, in the figure the ordinary television pictures are displayed on screen A and the still picture on screen B. In this way, in order to display the picture on one-fourth of the total screen area, in case of the Y signal, both the vertical and horizontal beam deflection at the read-out time may be made twice that at the recording time. But, in the case of the chrominance signal, th X signal and the Z signal are separately recorded on left and right-hand sides of a storage tube respectively, so that a special deflection has to be performed for read-out of the chrominance signal. The waveform of the horizontal deflection current for read-out is shown in FIG. 10.

Figure 11:
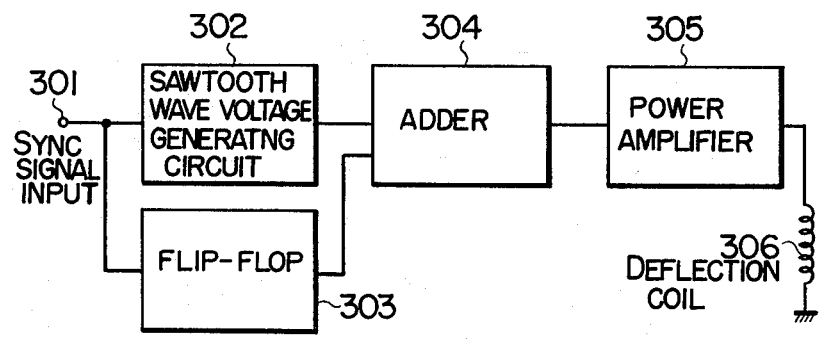
FIG. 11 is a block diagram of the deflection apparatus which is provided for scanning on the cathode ray tube.
Figure 12:
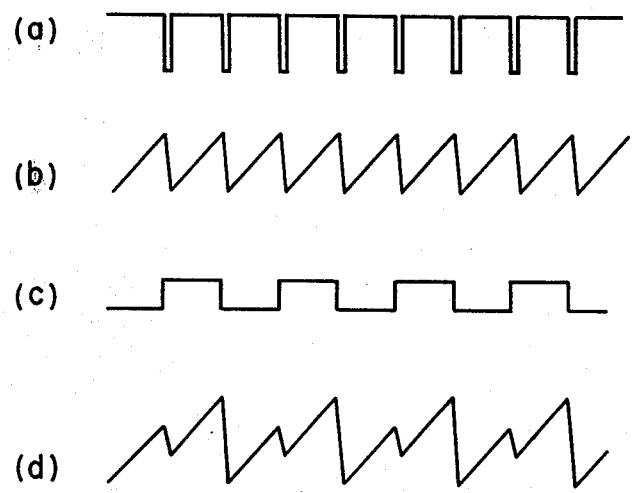
FIG. 12 is waveform diagram of the scanning performed by the apparatus of FIG. 12.

The circuit such as shown in FIG. 11 may be provided for producing an electric current having the waveform described above. A sync signal is applied to the circuit at a terminal 301, sawtooth wave voltage is generated by the sawtooth wave voltage generating circuit 302 and the sawtooth wave signal is added to the output of a flip-flop 303 in an adder circuit 304. The output voltage is applied to a power amplifier 305, and the output of the amplifier 305 is applied to a low impedance deflection coil 306 to produce a sawtooth wave current. The waveforms occurred at various portions of FIG. 11 are shown in FIG. 12 wherein (a) is the sync signal applied to the terminal 301, (b) the output waveform produced by sawtooth voltage generating circuit 302, (c) the output waveform generated in the flip-flop, and (d) the output waveform of the adder circuit 304 and the waveform of the current flowing through the deflection coil. As described above, if a special deflection current is desired a low impedance deflection coil is necessary in the circuit shown in FIG. 11 and the introduces complication in construction of the circuit.

Figure 13:
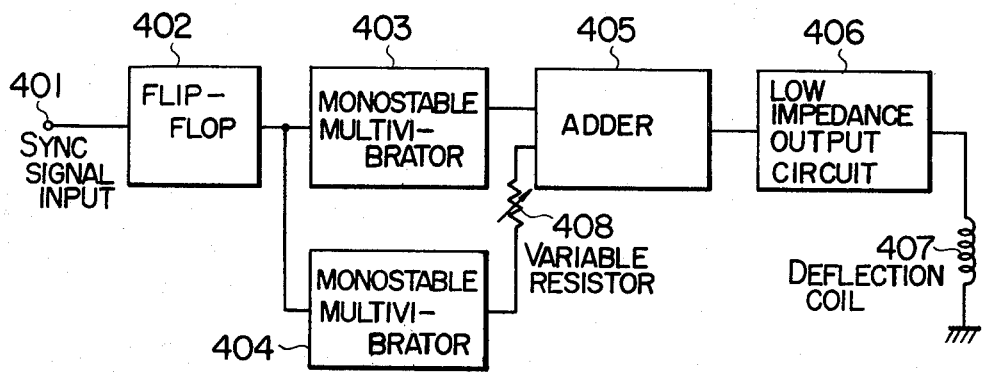
FIG. 13 is a block diagram showing another embodiment of a deflection apparatus according to the present invention.
Figure 14:
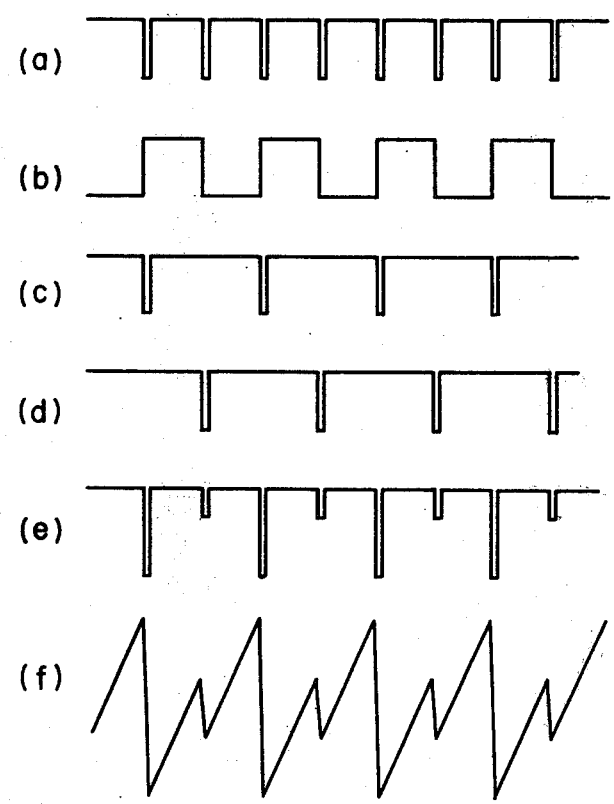
FIG. 14 is a waveform diagram for the apparatus shown in FIG. 13.

An embodiment of the present invention which is free from the above disadvantage is shown in FIG. 13 and will be described as follows. In FIG. 13 numeral 401 designates an input terminal for application of a sync signal, 402 a flip-flop, 403 a monostable multivibrator which generates a pulse at its rising period, 404 a monostable multivibrator which generates a pulse at its falling period, 405 an adder circuit, 406 a low impedance output circuit, 407 a deflection coil, and 408 a variable resistor. In FIG. 14, (a) designates the sync signal applied to terminal 401, (b) the output waveform of the flip-flop 402, (c) the output waveform of the monostable multivibrator 403, (d) the output waveform of the monostable multivibrator 404, (e) the output waveform of the adder circuit 405 and the low impedance output circuit 406, and (f) the waveform of the current flowing through the deflection coil. The flip-flop 402 is operated by the sync signal from the terminal 401. On rising and falling of the output of the flip-flop 402 the monostable multivibrators 403 and 404 are respectively operated to produce pulse of fixed width. The output pulses of the multivibrators 403 and 404 are alternatively produced as shown in FIGS. 14(c) and (d) and they are added together in the adder circuit 405. Further they are amplified in the low impedance output circuit 406 and applied to the deflection coil to produce a sawtooth current. If the real component of resistance of the coil 407 is small enough on applying pulse voltage to the coil 407, the current flowing through 407 is approximately equivalent to a sawtooth current. The variable resistor 408 shown in FIG. 13 is provided to set the levels of the sawtooth current having two different current peaks. The values of voltage corresponding to the two different pulses are set equal by adjustment of the resistance of the resistor 408 and thus a sawtooth wave having no variation in its amplitude can be obtained. Although in the above explanation the levels of the amplitudes of the sawtooth wave are set by the pulse height, it is evident similar result can be obtained by level setting based on the variation of pulse width.

What we claim is:

1. A deflection apparatus including means for receiving a standard color television signal; means for separating a synchronous signal, two kinds of chrominance signals and a luminance signal; means for recording said two kinds of chrominance signals on two divided different parts of a storage tube target; and adding means for applying said two kinds of chrominance signals to a television receiver having a deflection coil; wherein said apparatus further comprises:
   means receiving said synchronous signal for frequency-dividing said synchronous signal by the factor of $n$, where $n$ is an integer;
   a circuit including $n-1$ cascade-connected pulse generators each generating pulses having a period which is equal to that of said synchronous signals;
   means for connecting said cascade-connected circuit to an output terminal of said means for frequency-dividing and adjusting the levels of the output pulses from said pulse generators and adding them together to produce a step function wave signal;
   means for generating a saw-tooth wave in synchronism with said synchronous signal; and
   means for adding said saw-tooth wave signal to said step-function wave signal, the output of said adding means being coupled to said deflection coil.

2. A deflection apparatus according to claim 1 wherein said means for frequency-dividing consists of a circuit including $n/2$ cascade-connected flip-flops, and said pulse generators each consists of a monostable multivibrator having a meta-stable period which is equal to said period of said synchronous signal.

3. A deflection apparatus according to claim 1 wherein said synchronous signal is a vertical synchronous signal in a television signal.

* * * * *